(12) United States Patent
Gorman et al.

(10) Patent No.: US 9,946,620 B2
(45) Date of Patent: Apr. 17, 2018

(54) MEMORY BUILT-IN SELF TEST SYSTEM

(71) Applicant: Invecas, Inc., Santa Clara, CA (US)

(72) Inventors: Kevin W. Gorman, Essex, VT (US);
Thomas Chadwick, Essex, VT (US);
Nancy Pratt, Essex, VT (US)

(73) Assignee: Invecas, Inc., Santa Clara, CA (US)

( * ) Notice: Subject to any disclaimer, the term of this patent is extended or adjusted under 35 U.S.C. 154(b) by 172 days.

(21) Appl. No.: 15/012,707

(22) Filed: Feb. 1, 2016

(65) Prior Publication Data

US 2016/0224450 A1   Aug. 4, 2016

Related U.S. Application Data

(60) Provisional application No. 62/111,608, filed on Feb. 3, 2015.

(51) Int. Cl.
| | |
|---|---|
| *G11C 29/00* | (2006.01) |
| *G01R 31/28* | (2006.01) |
| *G06F 11/263* | (2006.01) |
| *G11C 29/16* | (2006.01) |
| *G11C 29/14* | (2006.01) |
| *G11C 29/04* | (2006.01) |

(52) U.S. Cl.
CPC ............ *G06F 11/263* (2013.01); *G11C 29/14* (2013.01); *G11C 29/16* (2013.01); *G11C 2029/0401* (2013.01)

(58) Field of Classification Search
CPC ............... G06F 11/263; G06F 11/2733; G11C 2029/0401; G11C 29/14; G11C 29/16; G11C 29/26; G11C 2207/04; G11C 31/31905; G11C 31/31724

USPC .... 714/6.2, 718, 733, 734, 763, 772, 31, 32, 714/33, 820; 365/49.1, 200, 201, 220, 365/230.05; 324/211, 527, 754, 757, 758, 324/763, 765

See application file for complete search history.

(56) References Cited

U.S. PATENT DOCUMENTS

| | | | |
|---|---|---|---|
| 7,472,325 B2 | 12/2008 | Dreibelbis et al. | |
| 7,631,236 B2 | 12/2009 | Gorman et al. | |
| 8,145,965 B2* | 3/2012 | Nagatani | G01R 31/31935 714/719 |
| 8,910,001 B2 | 12/2014 | Hamdioui et al. | |
| 9,201,750 B2* | 12/2015 | Sugimura | G06F 11/263 |

(Continued)

FOREIGN PATENT DOCUMENTS

| | | |
|---|---|---|
| EP | 1303815 B1 | 2/2004 |
| WO | 2004086411 A1 | 10/2004 |
| WO | 2006055862 A2 | 5/2006 |

*Primary Examiner* — Christine T. Tu
(74) *Attorney, Agent, or Firm* — Venture Pacific Law, PC

(57) ABSTRACT

A memory built-in self test ("BIST") system comprises: a controller; a single port memory engine coupled to one or more single port memories; and a non-single port memory engine coupled to one or more non-single port memories. The controller receives operation codes ("op-codes") for testing a plurality of memory types. An output of the controller is coupled to inputs of the single port memory engine and the non-single port memory engine. The controller generates test instructions based on the received op-codes. The single port memory engine and the non-single port memory engine interpret the test instructions to test the one or more single port memories and the one or more non-single port memories.

18 Claims, 4 Drawing Sheets

(56) References Cited

U.S. PATENT DOCUMENTS

| | | | |
|---|---|---|---|
| 2007/0070743 A1* | 3/2007 | Do | G11C 8/16 365/201 |
| 2007/0165469 A1* | 7/2007 | Rehm | G01R 31/31905 365/201 |
| 2013/0019130 A1 | 1/2013 | Hakhumyan et al. | |

* cited by examiner

Fig. 2a

| Control 54 | Addr. Direct. 53 | Reserved 52 | Operation Type 51 | Operation Disable 50 | Special Modifier 49 | Data 48 |

Fig. 2b

| Control 61 | Addr. Direct. 60 | Operation Type 59 | Search Expect/ Data Valid 58 | Operation Disable 57 | Special Modifier 56 | Data 55 |

Fig. 2c

| Control 81 | Addr. Direct. 80 | Operation Type A Port 79 | Operation Type B Port 78 | Data A Port 77 | Operation Disable Port B 76 | Special Modifier 75 | Data B Port 74 |

MEMORY BUILT-IN SELF TEST SYSTEM

CROSS REFERENCE

This application claims priority from a provisional patent application entitled "Flexible Memory BIST Architecture" filed on Feb. 3, 2015 and having application No. 62/111,608. Said application is incorporated herein by reference.

FIELD OF INVENTION

The present disclosure relates to circuits, methods, and systems for a built-in self test ("BIST") controller, and, more particularly, to a BIST controller for embedded memories of a system-on-chip ("SOC") device.

BACKGROUND

More memory is being embedded into system-on-chip ("SOC") devices in order to provide increasing functionality. Many SOC devices have more than 50% of their area devoted to embedded memories. Ensuring these memories are valid and operating correctly is of the upmost importance for producing SOC devices. In addition, as memory content increases, those memories become more susceptible to defects and variations in the chip parametric as technology feature sizes decrease. Thus, the memories of the SOC devices require methods and systems for thorough and efficient testing, repairing, and diagnosis.

A memory built-in self test ("BIST") has emerged as the most effective way to test, repair, and diagnose the numerous memory instances found in modern SOC devices. Typical BIST circuits are coupled to each type of embedded memory of the SOC devices. Thus, if a SOC device has a single port memory device, a ternary content addressable memory ("TCAM") device, and a non-single port memory device, a separate BIST controller is coupled to each type of memory device. This leads to inefficient use of the SOC area and additional complexity when testing the multiple memory types of the SOC device. Therefore, it is desirable for providing a BIST architecture that provides additional features for improving the quality of testing of a SOC device while minimizing BIST circuit area overhead.

SUMMARY OF INVENTION

Briefly, the disclosure relates to a memory built-in self test ("BIST") system, comprising: a controller, wherein the controller receives operation codes ("op-codes") for testing a plurality of memory types; a single port memory engine coupled to one or more single port memories; and a non-single port memory engine coupled to one or more non-single port memories, wherein an output of the controller is coupled to inputs of the single port memory engine and the non-single port memory engine, wherein the controller generates test instructions based on the received op-codes, and wherein the single port memory engine and the non-single port memory engine interpret the test instructions to test the one or more single port memories and the one or more non-single port memories.

DESCRIPTION OF THE DRAWINGS

The foregoing and other aspects of the disclosure can be better understood from the following detailed description of the embodiments when taken in conjunction with the accompanying drawings.

FIG. 2a illustrates a data structure for an op-code of the present disclosure for testing single port memories.

FIG. 2b illustrates a data structure for an op-code of the present disclosure for testing TCAMs.

FIG. 2c illustrates a data structure for an op-code of the present disclosure for testing multi-port memories.

DETAILED DESCRIPTION OF THE EMBODIMENTS

In the following detailed description of the embodiments, reference is made to the accompanying drawings, which form a part hereof, and in which is shown by way of illustration of specific embodiments in which the disclosure may be practiced. It is understood that a memory BIST system of the present disclosure and various memories coupled to the memory BIST system (e.g., single port memories and non-single port memories) can be components in a system-on-chip ("SOC") device. To aid in the understanding of the present disclosure, other components known to the current art within a SOC device may be omitted from the present disclosure. However, it is appreciated by a person having ordinary skill in the art that the present disclosure can work in conjunction with such components.

A memory BIST Controller ("MBC") of the present disclosure can test a variety of memory types, including a single port static random access memory ("SRAM"), a multi-port SRAM, a dynamic random access memory ("DRAM"), a TCAM memory, etc. The MBC can be programmed via a multi-use operation code ("op-code") structure to perform basic memory tests in a single port mode, which generates patterns that can be applied in parallel to all typical memory types that include both a write and a read capability. The MBC can also be programmed via the multi-use op-code structure in a different fashion to perform tests targeted to specific non-single port memories (e.g. multi-port memories and/or TCAM memories).

The single MBC can be coupled to all of the memories of a SOC device, regardless of the memory type. This decreases the cost for research and development associated with creating BIST circuit designs for the SOC device since memory type specific BIST controllers are not required for each of the different memory types of the SOC device. Rather, the single MBC of the present disclosure is shared among the different memory instances. Thus, the BIST circuit area overhead for the respective SOC device is greatly reduced. The MBC is further programmable to ensure that a thorough test, repair, and diagnostic sequence can be performed on the memories of the respective SOC device. The test sequences and patterns can be changed in software based on previous test results and other learning, which provides for a much more flexible and ultimately higher quality test. Alternatively, typical hard-coded sequences can also be used in conjunction with the MBC of the present disclosure and can be adjusted as needed.

Figure 1:
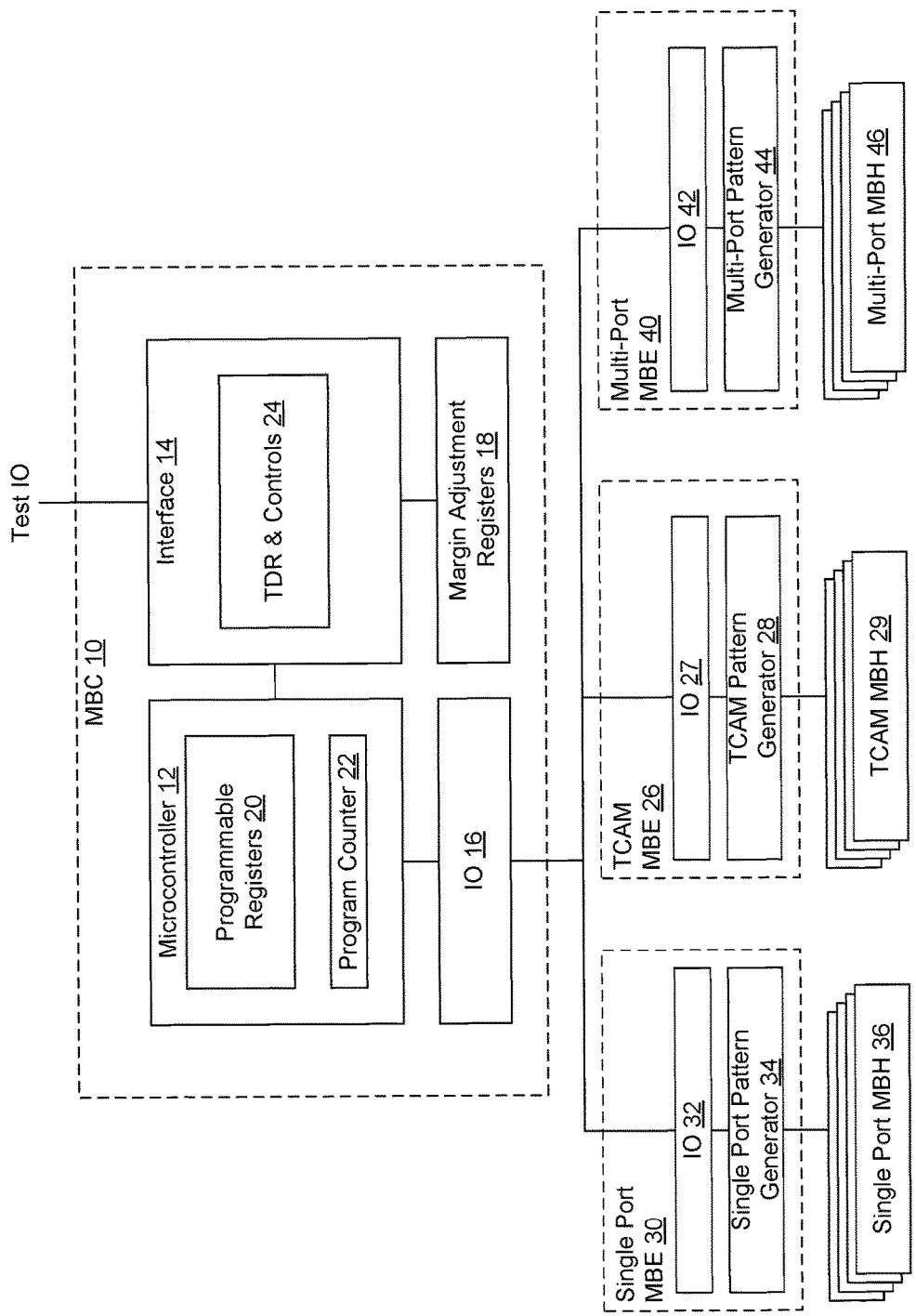
FIG. 1 illustrates a memory BIST system of the present disclosure.

FIG. 1 illustrates a memory BIST system of the present disclosure. A memory BIST system comprises an MBC 10, a single port memory BIST engine ("MBE") 30, a TCAM MBE 26, and a multi-port MBE 40. To aid in the understanding of the present disclosure, the MBE's 30, 26, and 40 are illustrated in the figures as an example of various engines that can be utilized in conjunction with the MBC of the present disclosure. However, it is appreciated that other MBEs can be included or excluded in a BIST system of the present disclosure as desired or needed.

An output of the MBC 10 is coupled to inputs of the single port MBE 30, TCAM MBE 26, and the multi-port MBE 40. The single port MBE 30's output is coupled to a single port memory BIST harness ("MBH") 36. The single port MBH 36 comprises a single port memory under test, test input/output logic for controlling and observing the memory IO during the test, and repair circuits (not shown). The TCAM MBE 26's output is coupled to TCAM MBH 29. The TCAM MBH 29 comprises a TCAM memory under test, test input/output logic for controlling and observing the memory IO during the test, and repair circuits (not shown). The multi-port MBE 40's output is coupled to multi-port MBH 46. The multi-port MBH 46 comprises a multi-port memory under test, test input/output logic for controlling and observing the memory IO during the test, and repair circuits (not shown).

The MBC 10 comprises a microcontroller 12 having programmable registers 20 and a program counter 22, an interface 14 having test data registers ("TDR") and controls 24, an input/output ("IO") 16, and margin adjustment registers 18. The memory BIST system is a high level illustration of an architecture of the present disclosure. Details of such architecture will become apparent through the present disclosure to a person having ordinary skill in the art.

The MBC 10 is programmed via the interface 14. The interface 14 can be a standardized interface having the test data registers and controls 24. The test data registers can be connected to any typical SOC network (e.g., IEEE 1149.1 or 1687 networks would suffice). Via that interface 14, operation codes ("op-codes") are loaded into the MBC 10 to program a particular test sequence for single port memories and non-single port memories that are coupled to the MBC 10 via the MBEs 30, 26, and 40 and the MBHs 36, 29, and 46. These op-codes are stored in programmable registers 20.

The MBEs 30, 26, and 40 are each specific to a particular memory type (e.g., a single port memory type, a multi-port memory type, a TCAM type, etc.). The MBE 30 comprises an IO bus 32 and a single port pattern generator 34. The IO bus 32 receives input from the MBC 10 and passes that information to the single port pattern generator 34. The single port pattern generator 34 interprets that information to generate data, address, and commands for testing of a single port memory under test that is coupled to the MBH 36. The single port pattern generator 34 can comprise a data generator, a command generator, and an address generator (not shown) to generate the test instructions to the MBH 36 at-speed. The data generator, command generator and address generator are logic structures used to generate the inputs for controlling a memory under test. The data generator logic interprets information in the op-codes and produces a sequence of data input values to write to the memory or expected data values to compare against memory data outputs after a read operation. The command generator logic interprets information in the op-codes and produces a sequence of commands to apply to the memory to cause write operations, read operations or other operations (like TCAM-specific search operations). The address generator logic interprets information in the op-codes and produces a sequence of memory addresses to apply to the memory.

Additionally, the MBE 26 comprises an IO bus 27 and a TCAM pattern generator 28. The IO bus 27 receives input from the MBC 10 and passes that information to the TCAM pattern generator 28. The TCAM pattern generator 28 interprets that information to generate data, address, and commands for testing of a TCAM memory under test that is coupled to the MBH 29. The TCAM pattern generator 28 can comprise a data generator, a command generator, and an address generator (not shown) to generate the test instructions to the MBH 29 at-speed.

Likewise, the MBE 40 comprises an IO bus 42 and a multi-port pattern generator 44. The IO bus 42 receives input from the MBC 10 and passes that information to the multi-port pattern generator 44. The multi-port pattern generator 44 interprets that information to generate data and address commands for testing of a multi-port memory under test that is coupled to the MBH 46. The multi-port pattern generator 44 can comprise a data generator, a command generator, and an address generator (not shown) to generate the test instructions to the MBH 46 at-speed.

The MBEs 30, 26, and 40 can communicate with additional MBHs (not shown), where each of the MBHs comprises a memory under test, some test IO ("TIO") logic for controlling and observing the memory IO during testing, and related repair circuits.

Different patterns loaded into the TDR 24 encode different MBC 10 operations (e.g., programming test mode and margin adjustment registers 18, programming op-codes into the programmable registers 20, running BIST sequences after programming, etc.). The program counter 22 steps through the programmable memory during a test pattern. The program counter 22 can also track when a program counter loop occurs and determines the starting address and stopping address of the loop. It also contains logic to identify when a new run sequence has been triggered, which is used to increment the counter. The test sequences are transmitted via the IO 16 of the MBC 10 to the MBEs 30, 26 and 40 for interpretation and application.

Additionally, the margin adjustment registers 18 can store setting and internal timings for the memories (e.g., timing for word line activation and voltage levels). The registers 18 can be set to different values in order to fine tune the memory behavior.

FIG. 2a illustrates a data structure for an op-code of the present disclosure for testing single port memories. An op-code data structure can be designed to be interpreted differently for various types of memories. In an example of such op-code structure for testing single port memories, the op-code can comprise a control field 54, an address direction field 53, a reserved field 52, an operation type field 51, an operation disable field 50, a special modifier field 49, and data 48. It is important to note that the op-code structure for testing single port memories can also be used to for basic read and write testing for non-single port memories, including TCAMs and multi-port memories. Additional op-code data structures using the same number of bits as the op-code structure for single port memories can also be used to test memory type specific functions of TCAMs and multi-port memories, as will become evident below.

The control field 54 indicates a type of programmable sequence. The types of programmable sequences can include an end of test ("EOT") sequence, hard-coded operations sequence, programmable operation with a loop sequence, programmable operation over a defined number of test patterns sequence, and other sequences can be reserved for use based on the design of the respective BIST system.

The end of test sequence ends a run operation and sets a status bit to reflect an MBC done status. The done status can also occur automatically when the program counter 22 reaches the maximum address within the programmable registers 20. This control sequence may only be used if the pattern requires less than all of the available op-code registers. This MBC done status can then be used to control SOC test sequences, with further MBC programming and subsequent test operations occurring after the MBC done status bit is asserted indicating the current test operations are complete. The MBC done status bit can be accessed via the interface 14.

The hard-coded operations sequence allows the special modifier and operation disable fields to only apply to the first preset number of operations in the hard-coded pattern sequence. The data field can be a single bit indicating whether the hard-coded data pattern is inverted or not.

The programmable operation with a loop sequence allows for looping over multiple op-codes so that more than a preset number of programmable operations can be grouped together and applied to a single address (where a number of memory operations applied to a single address is typically referred to as a march element). Looping allows for a longer march element to be created. In an exemplary embodiment, the preset number of programmable operations can be equal to four. However, it is appreciated that various preset numbers of programmable operation may be used in conjunction with the present disclosure. A program counter loop will include any op-codes carrying such "programmable operation with a loop sequence" control value and the first op-code without such control value. The address generation logic in an MBE block will only increment on the last op-code in the loop group and will only fall out of that loop when that address counter(s) carry (i.e., reached its maximum number).

The programmable operation over a defined number of test patterns sequence allows a defined or fixed number of programmable operations to be applied to a single address. The number of operations could be defined as one, two, three or four in this exemplary embodiment. If more operations need to be applied to a single address (i.e. a longer march element needs to be constructed), then the programmable operation with a loop sequence can be used.

The address direction field 53 indicates a direction of memory address counters, i.e., whether the address applied to the memory during test is incrementing versus decrementing. For instance, address direction value of "1" can mean increment, whereas the address direction value of "0" can mean to decrement.

The reserved field 52 can be used to reserve bits in the op-code for additional functionality. In this exemplary embodiment it is simply extra bits that are not used for testing basic read and write functions, but are instead only employed when the programmable register 20 is used for storing op-codes for TCAM or multi-port testing.

The operation type field 51 indicates a type of operation (e.g., write, read, etc.). For programmable operations (as determined by the control field), the operation type 51 serves as a field that indicates whether a read or write operation occurs. A "1" value in this field 51 can indicate a write, and a "0" value in this field 51 can indicate a read. The field can be comprised of multiple bits that are able to store multiple values, where each value represents a different operation to apply in series. For a programmable operation with a defined test pattern sequence of four, the first bit could define whether a read or write occurs first for a given memory address, the second bit could define whether a read or write occurs second for a given memory address, the third bit could define whether a read or write occurs third for a given memory address and the fourth bit could define whether a read or write occurs fourth for a given memory address. All other fields use a similar set of bits to indicate how to apply their programming over a series of operations.

The special modifier field 49 indicates any special operations (e.g., loop, hammer, no-op, etc.). The special operation type is determined by values in fields encoded within the pattern loaded into the TDR for running BIST sequences. For a loop setting, the loop begins with the first operation that has a special modifier bit set and ends with either the last remaining operation or the last operation with a special modifier bit set, whichever occurs first. Multiple loops may not be set within a single op-code or for multiple op-codes joined together via the program counter looping across op-codes. The loop must typically occur in the first op-code when multiple op-codes are joined together via the program counter looping. This loop function allows for a subset of operations to be applied across a portion of the memory address space.

For a hammer setting, each operation with a special modifier bit set will be repeated (i.e., so called "hammered") N times, where N is determined by the hammer/repeat sub-field of the address option test mode register. Multiple hammer operations can occur with a single op-code. For a no-op setting, any operation with a special modifier bit set will have the memory chip enable (or equivalent) control deasserted in order to prevent an active update of the memory (i.e. to prevent performing a read, write, or other active operation).

The operation disable field 50 indicates whether a disabled operation should occur (e.g., a dummy write or a dummy read). For a write operation, the bit-writes (or equivalent) can be deasserted for any operation disable bit that is set. For a read operation, the compare command in the MBH TIO block can be disabled for any operation disable bit that is set. The data field 48 indicates a data value to be used for each operation. A "0" value could indicate that true data patterns should be applied for that operation, whereas a "1" value could indicate that inverted data patterns should be applied for that operation.

FIG. 2b illustrates a data structure for an op-code of the present disclosure for testing TCAMs. The op-code translation for the data structure can differ when a TCAM memory is under test by the MBC 10. In particular, the fields of the op-code data structure can be interpreted differently from a single port memory by the MBC 10. The TCAM configuration may slightly reduce the programmable operation flexibility by reducing the maximum number of programmable operations when using a predefined number of bits for a multi-use op-code data structure. However, more control of the test operation is provided using such data structure such that search operations (and their related hit or miss result) can be described. In an example, the op-code for testing TCAMs can comprise a control field 61, an address direction field 60, an operation type 59, a search expect/data valid field 58, an operation disable field 57, a special modifier field 56, and data 55.

The control field 61 indicates the type of programmable sequence of the respective op-code. One type of programmable sequence is an end of test sequence. The end of test sequence ends a run operation and sets a status bit to reflect an MBC done status. The done status can also occur automatically when the program counter 22 reaches the maximum address within the programmable registers 20. This control sequence may only be used if the pattern requires less than all of the available op-code registers. This MBC done status can then be used to control SOC test sequences, with further MBC programming and subsequent test operations occurring after the MBC done status bit is asserted indicating the current test operations are complete. The MBC done status bit can be accessed via the interface 14.

The hard-coded operations sequence allows the special modifier and operation disable fields to only apply to the first preset number of operations in the hard-coded pattern sequence. The data field can be a single bit indicating whether the hard-coded data pattern is inverted or not.

The programmable operation with a loop sequence allows for looping over multiple op-codes so that more than a preset number of programmable operations can be grouped together and applied to a single address (where a number of memory operations applied to a single address is typically referred to as a march element). Looping allows for a longer march element to be created. In an exemplary embodiment, the preset number of programmable operations can be equal to four. However, it is appreciated that various preset numbers of programmable operation may be used in conjunction with the present disclosure. A program counter loop will include any op-codes carrying such "programmable operation with a loop sequence" control value and the first op-code without such control value. The address generation logic in an MBE block will only increment on the last op-code in the loop group and will only fall out of that loop when that address counter(s) carry (i.e., reached its maximum number).

The programmable operation over a defined number of test patterns sequence allows a defined or fixed number of programmable operations to be applied to a single address. The number of operations could be defined as one, two, or three in this exemplary embodiment. If more operations need to be applied to a single address (i.e. a longer march element needs to be constructed), then the programmable operation with a loop sequence can be used.

The address direction field 60 indicates a direction of memory address counters, i.e., whether the address applied to the memory during test is incrementing versus decrementing. For instance, address direction value of "1" can mean increment, whereas the address direction value of "0" can mean to decrement.

The operation type field 59 indicates a type of operation (e.g., write, read, search, etc.). For programmable operations (as determined by the control field), the operation type 59 serves as a field that indicates whether a read, write or other TCAM operation is provided, e.g., a normal search operation, a search using "walking-1" (one hot) data, etc. In an example, the single port memory type may have up to four bits in the operation type field to provide for four programmable operations that can encode two options each (e.g. read or write). However, for TCAMs, the operation type field can have six bits to provide for three programmable operations that can encode up to four options each (e.g. read, write, normal search, or walking-1 search). Thereby, more flexibility in operation type is provided at the cost of a reduction in the number of operations that can be applied to a given address (i.e. the maximum full programmable march sequence is limited to three operations). A "01" value in this field 59 can indicate a write, and a "00" value in this field 59 can indicate a read and a "10" value in this field 59 can indicate a normal search and a "11" value in this field 59 can indicate a walking-1 search.

The field can be comprised of these multiple sets of bits that are able to store multiple values, where each value represents a different operation to apply in series. For a programmable operation with a defined test pattern sequence of three, the first set of bits could define whether a read, write or search occurs first for a given memory address, the second set of bits could define whether a read, write or search occurs second for a given memory address, and the third set of bits could define whether a read, write or search occurs third for a given memory address. All other fields use a similar set of bits to indicate how to apply their programming over a series of operations.

The special modifier field 56 indicates any special operations (e.g., loop, hammer, no-op, etc.). The special operation type is determined by values in fields encoded within the pattern loaded into the TDR for running BIST sequences. For a loop setting, the loop begins with the first operation that has a special modifier bit set and ends with either the last remaining operation or the last operation with a special modifier bit set, whichever occurs first. Multiple loops may not be set within a single op-code or for multiple op-codes joined together via the program counter looping across op-codes. The loop must typically occur in the first op-code when multiple op-codes are joined together via the program counter looping. This loop function allows for a subset of operations to be applied across a portion of the memory address space.

For a hammer setting, each operation with a special modifier bit set will be repeated (i.e., so called "hammered") N times, where N is determined by the hammer/repeat sub-field of the address option test mode register. Multiple hammer operations can occur with a single op-code. For a no-op setting, any operation with a special modifier bit set will have the memory chip enable (or equivalent) control deasserted in order to prevent an active update of the memory (i.e. to prevent performing a read, write, or other active operation).

The operation disable field 57 indicates whether a disabled operation should occur (e.g., a dummy write or a dummy read). For a write operation, the bit-writes (or equivalent) can be deasserted for any operation disable bit that is set. For a read operation, the compare command in the MBH TIO block can be disabled for any operation disable bit that is set. The data field 55 indicates a data value to be used for each operation. A "0" value could indicate that true data patterns should be applied for that operation, whereas a "1" value could indicate that inverted data patterns should be applied for that operation.

The search expect/data valid field 58 can be unique to TCAMs for searching data. For instance, the search expect/data valid field 58, during search operations, represents the expected outcome of the search operation, e.g., hit or miss. During write operations, the field 58 represents the value written to the array data valid bits (e.g., true or complement to mark certain TCAM entries as valid or invalid).

FIG. 2c illustrates a data structure for an op-code of the present disclosure for testing multi-port memories. The op-code translation can also differ when a multi-port memory is being tested by an MBC of the present disclosure. The fields of the op-code data structure for multi-port memory can be customized to the multi-port memory and use the same number of total bits as the op-code data structure for TCAMs and single port memories. Such configuration constraints may slightly reduce the programmable operation flexibility, e.g., by reducing the maximum number of programmable operations to fit a predetermined number of bits for the op-code data structure. However, the op-code data structure can allow for more control of the test operation such that multi-port operations and their related data can be described and supported.

The TDR and controls 24 can interpret op-codes differently based on types. For instance, the data structure is structured so that the two separate ports are added for operation type A and operation type B. It is appreciated that other ports can be added as needed to the op-code to support other memory types.

A control field 81 indicates a type of programmable sequence. One type of programmable sequence is an end of test sequence. The end of test sequence ends a run operation and sets a status bit to reflect an MBC done status. The done status can also occur automatically when the program counter 22 reaches the maximum address within the programmable registers 20. This control sequence may only be used if the pattern requires less than all of the available op-code registers. This MBC done status can then be used to control SOC test sequences, with further MBC programming and subsequent test operations occurring after the MBC done status bit is asserted indicating the current test operations are complete. The MBC done status bit can be accessed via the Interface 14.

The hard-coded operations sequence allows the special modifier and operation disable fields to only apply to the first preset number of operations in the hard-coded pattern sequence. The data field can be a single bit indicating whether the hard-coded data pattern is inverted or not.

The programmable operation with a loop sequence allows for looping over multiple op-codes so that more than a preset number of programmable operations can be grouped together and applied to a single address (where a number of memory operations applied to a single address is typically referred to as a march element). Looping allows for a longer march element to be created. In an exemplary embodiment, the preset number of programmable operations can be equal to four. However, it is appreciated that various preset numbers of programmable operation may be used in conjunction with the present disclosure. A program counter loop will include any op-codes carrying such "programmable operation with a loop sequence" control value and the first op-code without such control value. The address generation logic in an MBE block will only increment on the last op-code in the loop group and will only fall out of that loop when that address counter(s) carry (i.e., reached its maximum number).

The programmable operation over a defined number of test patterns sequence allows a defined or fixed number of programmable operations to be applied to a single address. The number of operations could be defined as one, two, or three in this exemplary embodiment. If more operations need to be applied to a single address (i.e. a longer march element needs to be constructed), then the programmable operation with a loop sequence can be used.

The address direction field 80 indicates a direction of memory address counters, i.e., whether the address applied to the memory during test is incrementing versus decrementing. For instance, address direction value of "1" can mean increment, whereas the address direction value of "0" can mean to decrement.

Operation type A port 79 and type B port 78 indicates a type of operation, e.g., a write versus a read applied to a particular memory port. For programmable operations (as determined by the control field), the operation type A port 79 and type B port 78 serve as fields to indicate whether a read or write operation is provided for the respective port. In an example, the single port memory type may have up to four bits in the operation type field to provide for four programmable operations that can encode two options each (e.g. read or write). However, for multi-ports the operation type fields can each have three bits to provide for three programmable operations that can encode up to two options each (e.g. read or write) for each port. Thereby, more flexibility for controlling multiple ports is provided at the cost of a reduction in the number of operations that can be applied to a given address (i.e. the maximum full programmable march sequence is limited to three operations per port). A "1" value in this field 79 or 78 can indicate a write, and a "0" value in this field 79 or 78 can indicate a read. It is appreciated that other mapping schemes for values to commands (e.g., read, write, other) can be used in conjunction with the present disclosure. The aforementioned schemes are merely examples to illustrate the many mappings that may be used.

The operation type field can be comprised of these multiple sets of bits that are able to store multiple values, where each value represents a different operation to apply in series. For a programmable operation with a defined test pattern sequence of three, the first bit could define whether a read or write occurs first for a given memory address, the second bit could define whether a read or write occurs second for a given memory address, and the third bit could define whether a read or write occurs third for a given memory address. All other fields use a similar set of bits to indicate how to apply their programming over a series of operations.

The special modifier field 75 indicates any special operations (e.g., loop, hammer, no-op, etc.). The special operation type is determined by values in fields encoded within the pattern loaded into the TDR for running BIST sequences. For a loop setting, the loop begins with the first operation that has a special modifier bit set and ends with either the last remaining operation or the last operation with a special modifier bit set, whichever occurs first. Multiple loops may not be set within a single op-code or for multiple op-codes joined together via the program counter looping across op-codes. The loop must typically occur in the first op-code when multiple op-codes are joined together via the program counter looping. This loop function allows for a subset of operations to be applied across a portion of the memory address space.

For a hammer setting, each operation with a special modifier bit set will be repeated (i.e., so called "hammered") N times, where N is determined by the hammer/repeat sub-field of the address option test mode register. Multiple hammer operations can occur with a single op-code. For a no-op setting, any operation with a special modifier bit set will have the memory chip enable (or equivalent) control deasserted in order to prevent an active update of the memory (i.e. to prevent performing a read, write, or other active operation).

Operation disable port B 76 indicates whether a disabled operation should occur, e.g., a dummy write or read. For a write operation, the bit-writes (or equivalent) can be deasserted for any operation disable bit that is set. For a read operation, the compare in the MBH TIO block can be disabled for any operation disable bit that is set. This field can be only applied to port B of the memory in the current multi-port memory application. However, it is appreciated that other designs can be used in which the field 76 can apply to other ports of a respective memory or provide other functionalities to the MBC.

Data A port 77 and data B port 74 indicate data values, e.g., true or complement. A "0" value could indicate that true data patterns should be applied for that operation to that port, whereas a "1" value could indicate that inverted data patterns should be applied for that operation to that port. It is appreciated that the order of fields in the op-code data structure can be altered based on the present disclosure. The order of the fields stated in the present disclosure is merely meant to provide a few examples of op-code data structures of the present disclosure. It is appreciated that a person having ordinary skill in the art can alter the order of the fields, include additional fields, and/or alter the number of bits for each of the fields based on the present disclosure. The various different combinations are included in the scope of the present disclosure.

Figure 3:
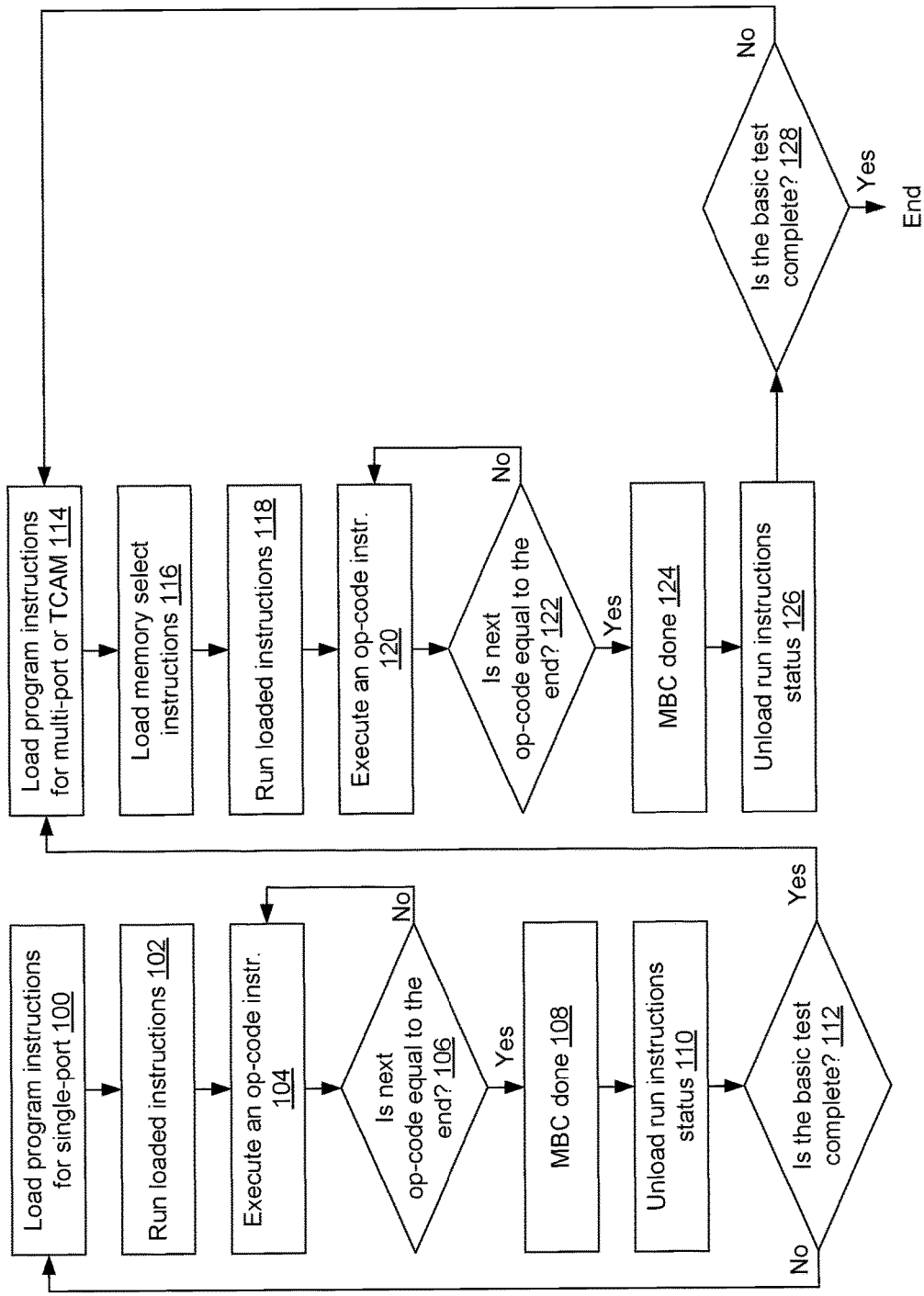
FIG. 3 illustrates a flow chart for operating a memory BIST system of the present disclosure.

FIG. 3 illustrates a flow chart for operating a memory BIST system of the present disclosure. Operationally, the MBC 10 has a microcontroller that increments a program counter 22 through a programmable memory 20. The op-codes (stored in the programmable memory 20) selected by the program counter (which acts as an address for the programmable memory) then drive the overall BIST execution. The programmable memory stores multiple test sequences in these op-codes with sequences commonly referred to as march elements. The march elements must be setup prior to issuing a run instruction. The memory size is compilable with a number of op-codes, where each op-code represents a march element or a portion of a march element if looping is used. The memory is programmed via the TDR instruction for loading op-codes into the programmable registers. This op-code structure can be used to create test patterns for all memory types.

Typical test sequences involve the following steps: programming the MBC, executing a pattern, capturing the results, and then programming a new test sequence. In an example of a flow chart of the present disclosure for operation of the MBC, op-code program instructions are loaded for a single port, step 100. The loaded instructions are run by the MBC, step 102. Next, an op-code instruction is executed based on the loaded instructions, step 104. It is determined whether the next op-code is equal to the end of the test, step 106. If not, then another op-code is executed, starting at step 104. If EOT is reached, the MBC is done, step 108. Accordingly, the run instructions status is unloaded, step 110.

It is determined whether the basic test is complete, step 112. The data unloaded with the run instruction status in step 110 is examined at the SOC, tester or system level to determine if the memories under test are passing or failing, if the test completed successfully, etc. If the basic test sequence is not completed, then additional op-code program instructions are loaded for the single port memory, starting at step 100. If the basic test is complete, testing for non-single port memories is performed in a non-basic test.

For the non-basic test, op-code program instructions for non-single port memories (e.g., multi-port memories or TCAMs) are loaded, step 114. The memory select instructions are then loaded, step 116. The memories that correspond to the specific type being tested (e.g. multi-port or TCAM) are selected and all other memory types are de-selected. Next, the loaded instructions are run, step 118. The op-code instructions based on the loaded instructions are executed, step 120. It is determined whether the next op-code is equal to the end of the test, step 122. If not, another op-code is executed, starting at step 120. If the EOT is reached, the MBC is done, step 124. The run instructions status is unloaded, step 126. The data unloaded with the run instruction status in step 126 is examined at the SOC, tester or system level to determine if the memories under test are passing or failing, if the test completed successfully, etc. It is determined whether the non-basic test is completed, step 128. If not, the steps for the non-basic test are repeated by loading the next program instructions, starting in step 114. If so, then the MBC is done and the flow ends.

In alternative embodiments, the flow of the MBC can be altered such that the non-basic test can be performed before the basic test, i.e., the non-single port instructions and op-codes are executed before single port instructions and op-codes. In a specific example, normal array functions for read/write operations can be verified using single port SRAM patterns. After that completes, several unique TCAM tests can be run to exercise the various search related operations. TCAM array data can be treated as normal SRAM cell contents during typical SRAM single-port type tests. These tests are designed to stress typical SRAM array defects. However, the array data needs to be treated in a special fashion for TCAM specific tests that are designed to stress TCAM functions, e.g., noise conditions and match line related defects. Furthermore, adequate TCAM testing may require a walking-1 capability for data and bit enables (e.g., search masks). Thus, different test sequences that use different op-code structures for enabling either longer march elements in SRAM single-port type tests or for more flexible operation sets (like complex TCAM search sequences) in TCAM type tests is supported.

For multi-port memory testing, there can be several key aspects to multi-port memory test. All of the normal array function for read/write operations can be verified using typical single port SRAM patterns. After that completes, several unique multi-port tests must be run to exercise the various multi-port related operations. For instance, the different port addresses are typically treated as related to each other. One address is the primary target, while the other address is treated as a disturb operation, i.e., noise generating operation. Usually this disturb operation is performed at the same address, e.g., a collision, at a nearby address, e.g., address+1, or at a distant address, e.g., an inverted address. For multi-port operations that involve reads from all ports, any of the addressing modes are typically viable with the understanding that for collisions, certain rules about whether the data is valid or not may apply. For multi-port operations that involve a write and a read, care must be taken with all of the address modes to avoid reading invalid or unexpected data, especially with the aliasing that can happen with inverted addresses. Thus, different test sequences that use different op-code structures for enabling either longer march elements in SRAM single-port type tests or for more flexible operation sets (like multi-port read and write operations) in multi-port type tests are supported.

Figure 4:
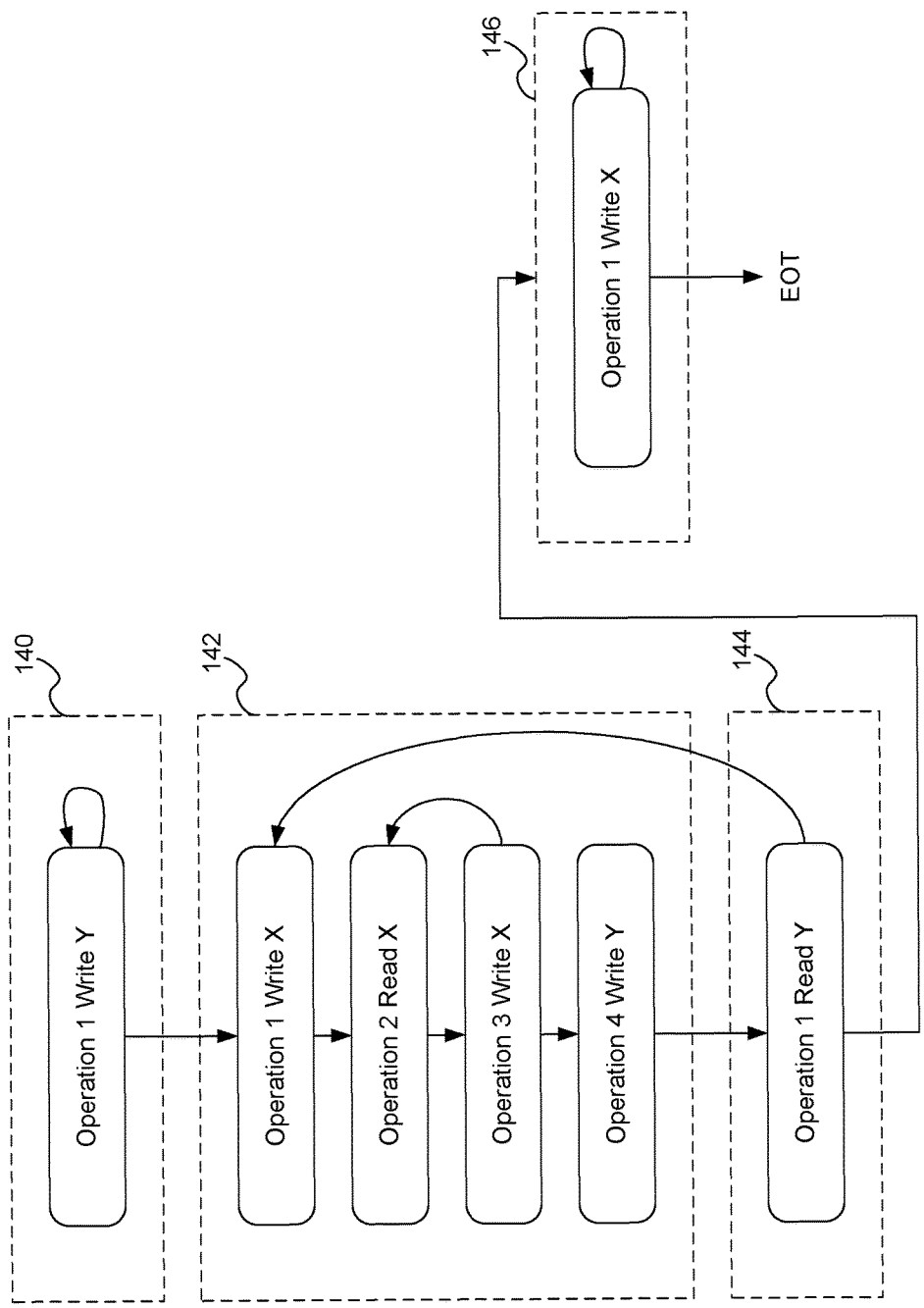
FIG. 4 illustrates an example of test instructions by a memory BIST system of the present disclosure using op-codes.

FIG. 4 illustrates an example of test instructions by a memory BIST system of the present disclosure using op-codes. In an example, an op-code data structure of the present disclosure can be used to support executing a predefined number of programmable operations at a given address. The total number of march elements can be greater than the predefined number by having looping and hammering fields in the op-code instructions to allow for additional passes using the same previous instruction(s) on different or the same memory addresses. Additionally, looping over multiple op-codes on the same address can also be enabled via the control field of the op-codes.

For instance, an op-code 140 can perform a test operation 1 to write Y across the full address space of the memory under test (whether it be a single port memory or a non-single port memory). Next, an op-code 142 provides for four test operations 1-4 of a write X, read X, write X, and write Y, where the operations 2 and 3 have a special modifier bit set to repeat such operations 2 and 3 over a row and/or a column subset of the address space of the memory under test. Next, an op-code 144 provides for a test operation 1 of a read Y, and then loops to perform the op-code 142 on the next address space. After this looping completes across the full address space of the memory under test (including repeated executions of the loop in op-code 142 on the subset of the address space each time the outer overall loop occurs), an op-code 146 provides for a test operation 1 of a write x that loops across the full address space of the memory under test. Finally, an end of test is reached and the testing is completed. It is understood that the above is only an example of the various looping and writing of several test instructions for a memory under test using an op-code data structure of the present invention.

While the disclosure has been described with reference to certain embodiments, it is to be understood that the disclosure is not limited to such embodiments. Rather, the disclosure should be understood and construed in its broadest meaning, as reflected by the following claims. Thus, these claims are to be understood as incorporating not only the apparatuses, methods, and systems described herein, but all those other and further alterations and modifications as would be apparent to those of ordinary skill in the art.

We claim:

1. A memory built-in self test ("BIST") system, comprising:
   a controller for generating test instructions based on received operation codes ("op-codes") for testing a plurality of memory types, wherein the controller comprises a microcontroller, an interface for receiving the op-codes to program the microcontroller with the test instructions, and an input/output ("IO") block;
   a single port memory BIST engine coupled to one or more single port memories, wherein the single port memory BIST engine comprises a first data generator, a first command generator, and a first address generator; and
   a non-single port memory BIST engine coupled to one or more non-single port memories, wherein the non-single port memory BIST engine comprises a second data generator, a second command generator, and a second address generator,
   wherein an output of the controller is coupled to inputs of the single port memory BIST engine and the non-single port memory BIST engine for inputting the test instructions to
   the single port memory BIST engine and the non-single port memory BIST engine to test the one or more single port memories and the one or more non-single port memories.

2. The memory BIST system of claim 1 wherein certain ones of the op-codes comprise the following fields: a control field, an address direction field, a reserved field, an operation type field, an operation disable field, a special modifier field, and a data field, wherein the control field supports looping across one or more of the op-codes, and wherein the special modifier field supports looping within operations of a certain one or more of the op-codes.

3. The memory BIST system of claim 2 wherein the certain ones of the op-codes are used to generate certain test instructions for the single port memories and the non-single port memories.

4. The memory BIST system of claim 1 wherein certain ones of the op-codes comprise the following fields: a control field, an address direction field, an operation type field, a search expect/data valid field, an operation disable field, a special modifier field, and a data field, wherein the control field supports looping across one or more of the op-codes, and wherein the special modifier field supports looping within operations of a certain one or more of the op-codes.

5. The memory BIST system of claim 4 wherein the certain ones of the op-codes are used to generate certain test instructions for ternary content addressable memories.

6. The memory BIST system of claim 1 wherein certain ones of the op-codes comprise the following fields: a control field, an address direction field, an operation type A port field, an operation type B port field, a data A port field, an operation disable port field, a special modifier field, and a data B port field, wherein the control field supports looping across one or more of the op-codes, and wherein the special modifier field supports looping within operations of a certain one or more of the op-codes.

7. The memory BIST system of claim 6 wherein the certain ones of the op-codes are used to generate certain test instructions for multi-port memories.

8. A memory built-in self test ("BIST") system, comprising:
   a controller, wherein the controller receives operation codes ("op-codes") for testing a plurality of memory types, wherein the controller comprises a microcontroller, an interface, and an input/output ("IO") block, and wherein the interface receives the op-codes to program the microcontroller with the test instructions;
   a single port memory engine coupled to one or more single port memories, wherein the single port memory engine comprises a first data generator, a first command generator, and a first address generator;
   a ternary content addressable memory ("TCAM") engine coupled to one or more TCAMs, wherein the TCAM engine comprises a second data generator, a second command generator, and a second address generator; and
   a multi-port memory engine coupled to one or more multi-port memories, wherein the multi-port memory engine comprises a third data generator, a third command generator, and a third address generator,
   wherein the test instructions are outputted to the single port memory engine, the TCAM engine, and the multi-port memory engine via the IO block,
   wherein an output of the controller is coupled to inputs of the single port memory engine, the TCAM engine, and the multi-port memory engine,
   wherein the controller generates test instructions based on the received op-codes, and wherein the single port memory engine, the TCAM engine, and the multi-port memory engine interpret the test instructions to test the one or more single port memories, the one or more TCAMs, and the one or more multi-port memories.

9. The memory BIST system of claim 8 wherein certain ones of the op-codes comprise the following fields: a control field, an address direction field, a reserved field, an operation type field, an operation disable field, a special modifier field, and a data field, wherein the control field supports looping across one or more of the op-codes, wherein the special modifier field supports looping within operations of a certain one or more of the op-codes, and wherein the certain ones of the op-codes are used to generate certain test instructions for the single port memories and the multi-port memories.

10. The memory BIST system of claim 8 wherein certain ones of the op-codes comprise the following fields: a control field, an address direction field, an operation type field, a search expect/data valid field, an operation disable field, a special modifier field, and a data field, wherein the control field supports looping across one or more of the op-codes, wherein the special modifier field supports looping within operations of a certain one or more of the op-codes, and wherein the certain ones of the op-codes are used to generate certain test instructions for the TCAMs.

11. The memory BIST system of claim 8 wherein certain ones of the op-codes comprise the following fields: a control field, an address direction field, an operation type A port field, an operation type B port field, a data A port field, an operation disable port field, a special modifier field, and a data B port field, wherein the control field supports looping across one or more of the op-codes, wherein the special modifier field supports looping within operations of a certain one or more of the op-codes, and wherein the certain ones of the op-codes are used to generate certain test instructions for the multi-port memories.

12. A method for a memory built-in self test ("BIST"), comprising the steps of:
   loading operation codes ("op-codes") to an interface of a controller;
   generating test instructions based on the loaded op-codes;
   outputting the test instructions to a single port memory BIST engine and a non-single port memory BIST engine via an input/output ("I/O") block of the controller;
   interpreting the test instructions and testing by one of the single port memory BIST engine and the non-single port memory BIST engine; and
   interpreting the test instructions and testing by another one of the single port memory BIST engine and the non-single port memory BIST engine.

13. The method for the BIST of claim 12 wherein certain ones of the op-codes comprise the following fields: a control field, an address direction field, a reserved field, an operation type field, an operation disable field, a special modifier field, and a data field, wherein the control field supports looping across one or more of the op-codes, and wherein the special modifier field supports looping within operations of a certain one or more of the op-codes.

14. The method for the BIST of claim 13 wherein the certain ones of the op-codes are used to generate certain test instructions for one or more single port memories and one or more non-single port memories.

15. The method for the BIST of claim 12 wherein certain ones of the op-codes comprise the following fields: a control field, an address direction field, an operation type field, a search expect/data valid field, an operation disable field, a special modifier field, and a data field, wherein the control field supports looping across one or more of the op-codes, and wherein the special modifier field supports looping within operations of a certain one or more of the op-codes.

16. The method for the BIST of claim 15 wherein the certain ones of the op-codes are used to generate certain test instructions for ternary content addressable memories.

17. The method for the BIST of claim 12 wherein certain ones of the op-codes comprise the following fields: a control field, an address direction field, an operation type A port field, an operation type B port field, a data A port field, an operation disable port field, a special modifier field, and a data B port field, wherein the control field supports looping across one or more of the op-codes, and wherein the special modifier field supports looping within operations of a certain one or more of the op-codes.

18. The method for the BIST of claim 17 wherein the certain ones of the op-codes are used to generate certain test instructions for multi-port memories.

\* \* \* \* \*